United States Patent
Liu et al.

(10) Patent No.: US 6,424,153 B1
(45) Date of Patent: Jul. 23, 2002

(54) ON-THE-FLY REMOVAL OF DATA INCONSISTENCY WITH K-SPACE OVERSAMPLING AND DEMODULATION IN MRI ACQUISITIONS

(75) Inventors: Kecheng Liu; Yansun Xu, both of Solon, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/448,351

(22) Filed: Nov. 23, 1999

(51) Int. Cl.[7] ............................................. G01V 3/00
(52) U.S. Cl. .................................. 324/309; 324/307
(58) Field of Search ............................... 324/309, 307, 324/318, 306, 314, 312; 600/410

(56) References Cited

U.S. PATENT DOCUMENTS

| | | | |
|---|---|---|---|
| 5,422,576 A | * 6/1995 | Kao et al. .................... | 324/309 |
| 5,539,312 A | * 7/1996 | Fu et al. ...................... | 324/309 |
| 5,545,993 A | * 8/1996 | Taguchi et al. ............. | 324/309 |
| 6,037,771 A | * 3/2000 | Liu et al. ..................... | 324/309 |
| 6,043,651 A | * 3/2000 | Heid ............................. | 324/307 |
| 6,043,654 A | * 3/2000 | Liu et al. ..................... | 324/309 |
| 6,057,685 A | * 5/2000 | Zhou ............................ | 324/306 |
| 6,066,949 A | * 5/2000 | Alley et al. .................. | 324/309 |
| 6,118,273 A | * 9/2000 | Takizawa et al. ........... | 324/309 |
| 6,313,629 B1 | * 11/2001 | Liu et al. ..................... | 324/309 |
| 6,331,777 B1 | * 12/2001 | Van Den Brink et al. .. | 324/312 |

FOREIGN PATENT DOCUMENTS

EP      WO 00/31559      * 6/2000

* cited by examiner

Primary Examiner—Edward Lefkowitz
Assistant Examiner—Tiffany A. Fetzner
(74) Attorney, Agent, or Firm—Fay, Sharpe, Fagan, Minnich & McKee, LLP

(57) ABSTRACT

A plurality of multiple echo imaging sequences are generated and sampled to fill k-space. Each multiple echo sequence includes a plurality of phase and frequency encoded image data echoes and a navigator echo, preferably at the end of the sequence. The navigator echoes are separated from the image data and analyzed to determine their relative phase angle and amplitude. More specifically to a preferred embodiment, a unit vector whose orientation is indicative of navigator echo phase angle relative to a reference angle is determined for each navigator echo. An amplitude correction value indicative of the amplitude of each navigator echo relative to a reference amplitude, such as an average navigator echo amplitude, is determined. The image date is adjusted with the relative phase angle and amplitude of the navigator echo from the same multiple echo sequence.

14 Claims, 3 Drawing Sheets

K-SPACE

| |
|---|
| FOURTH ECHO - FOURTH PULSE SEQUENCE |
| FOURTH ECHO - SECOND PULSE SEQUENCE |
| THIRD ECHO - FOURTH PULSE SEQUENCE |
| THIRD ECHO - SECOND PULSE SEQUENCE |
| SECOND ECHO - FOURTH PULSE SEQUENCE |
| SECOND ECHO - SECOND PULSE SEQUENCE |
| FIRST ECHO - FOURTH PULSE SEQUENCE |
| FIRST ECHO - SECOND PULSE SEQUENCE |
| FIRST ECHO - FIRST PULSE SEQUENCE |
| FIRST ECHO - THIRD PULSE SEQUENCE |
| SECOND ECHO - FIRST PULSE SEQUENCE |
| SECOND ECHO - THIRD PULSE SEQUENCE |
| THIRD ECHO - FIRST PULSE SEQUENCE |
| THIRD ECHO - THIRD PULSE SEQUENCE |
| FOURTH ECHO - FIRST PULSE SEQUENCE |
| FOURTH ECHO - THIRD PULSE SEQUENCE |

PHASE ENCODE

*Fig. 3*

ON-THE-FLY REMOVAL OF DATA INCONSISTENCY WITH K-SPACE OVERSAMPLING AND DEMODULATION IN MRI ACQUISITIONS

BACKGROUND OF THE INVENTION

The present invention relates to the art of magnetic resonance imaging (MRI). It finds particular application in conjunction with fast spin echo (FSE) imaging sequences, and will be described with particular reference thereto. However, it is to be appreciated that the present invention is also amenable to other magnetic resonance spectroscopy and imaging applications, particularly MRI techniques employing multi-echo pulse sequences having relatively long echo-trains such as, e.g., Sliding INterleaved $k_y$ (SLINKY) acquisition techniques, shifted interleaved multi-volume acquisition (SIMVA) techniques, other three-dimensional fast spin echo (3DFSE) techniques, etc.

Commonly, in MRI, a substantially uniform temporally constant main magnetic field, $B_0$, is set up in an examination region in which a subject being imaged is placed. Via magnetic resonance RF excitation and manipulations, selected magnetic dipoles in the subject which are otherwise aligned with the main magnetic field are tipped (via radio frequency (RF) pulses) into a plane transverse to the main magnetic field such that they precess or resonate. In turn, the resonating dipoles are allowed to decay or realign with the main magnetic field thereby inducing magnetic resonance echoes. The various echoes making up the MRI signal a encoded via magnetic gradients set up in the main magnetic field. The raw data from the MRI apparatus is collected into a matrix commonly known as k-space. Typically, each echo is sampled a plurality of times to generate a data line or row of data points in k-space. The echo or data lines position in k-space is determined by its gradient encoding. Ultimately, employing Inverse Fourier or other known transformations, an image representation of the subject is reconstructed from the k-space data.

At times, due to non-ideal system performance or in the case of some specific data acquisition strategies, MRI signals are distorted or contaminated in either phase or amplitude leading to data inconsistencies in k-space. One potential inconsistency is that each resonance excitation is not precisely the same amplitude or the same phase. Consequently, the result is degraded image quality. Traditional methods of addressing this problem are designed to minimize those known factors affecting image quality, such as gradient non-linearity, etc. One of these methods is, for example, pre-calibration in FSE or multi-shot type sequences which pre-emphasize the data error. Typically, resonance is excited and all or a portion of an echo train is generated to produce reference or calibration echoes. However, with longer echo-trains, such techniques are relatively time consuming and inefficient. Moreover, as the relevant techniques only use data collected prior to the imaging experiment, they are limited to correcting for k-space data errors that result from anomalies which are time-invariant over the duration of the imaging sequence (for example, spatially dependent errors). Accordingly, time dependent error such as, e.g., those created by motion or other dynamic factors, are not compensated for.

The present invention contemplates a new and improved technique for addressing data inconsistencies in k-space which overcomes the above-referenced problems and others.

SUMMARY OF THE INVENTION

In accordance with one aspect of the present invention, a method of magnetic resonance imaging includes producing a plurality of imaging sequences with an MRI apparatus. Each imaging sequence generates a multiple echo echo-train which issues from a subject being imaged. Each echo is phase encoded and collected into k-space as a plurality of sampled data points. The plurality of sampled data points are located in k-space based upon the phase encoding of each collected echo. An additional navigator echo is generated and collected in conjunction with each of the plurality of imaging sequences. The sampled data points in k-space are adjusted to account for data inconsistencies based upon information gleaned from the collected navigator echoes.

In accordance with another aspect of the present invention, a magnetic resonance imaging apparatus includes a main magnet that generates a substantially uniform temporally constant main magnetic field through an examination region wherein an object being imaged is positioned. A magnetic gradient generator produces magnetic gradients in the main magnetic field across the examination region. A transmission system includes an RF transmitter that drives an RF coil which is proximate to the examination region. A sequence control manipulates the magnetic gradient generator and the transmission system to produce a plurality MRI pulse sequences. Each of the MRI pulse sequences induces (i) an echo-train including a number of imaging echoes and (ii) a navigator echo, both of which stem from the object. A reception system includes a receiver that receives the imaging echoes and the navigator echoes. The imaging echoes get loaded into a first data storage device as k-space data and the navigator echoes get loaded into a second data storage device. A data processor accesses the first and second data storage devices to correct the k-space data in accordance with error factors generated from the navigator echoes. A reconstruction processor accesses the first data storage device and applies a multi-dimensional Fourier transformation to the k-space data therein such that an image of the object is reconstructed. Ultimately, an output device produces a human viewable rendering of the image.

One advantage of the present invention is improved image quality and artifact elimination.

Another advantage of the present invention is efficient data acquisition.

Yet another advantage of the present invention is the ability to correct for time-variant data errors in k-space.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
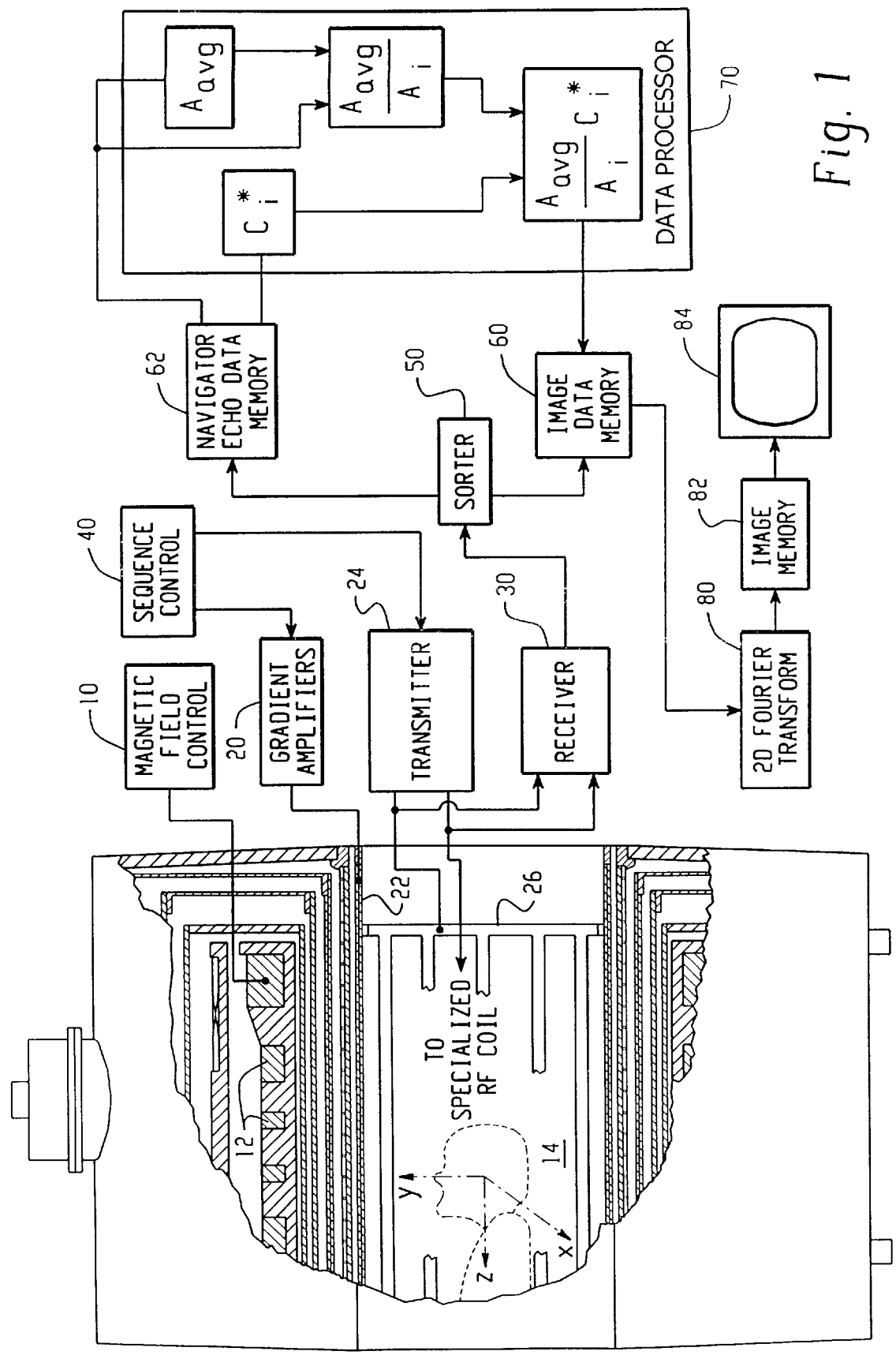
FIG. 1 is a diagrammatic illustration of an MRI apparatus in accordance with aspects of the present invention.

With reference to FIG. 1, a main magnetic field control 10 controls superconducting or resistive magnets 12 such that a substantially uniform, temporally constant main magnetic field, $B_0$, is created along a z axis through an examination region 14. A couch (not illustrated) suspends and/or positions an object to be examined, such as a patient or phantom, within the examination region 14. A magnetic resonance echo means applies a series of RF and magnetic field gradient pulses to invert or excite magnetic spins, induce magnetic resonance, refocus magnetic resonance, anipulate magnetic resonance, spatially and otherwise encode the magnetic resonance, to saturate spins, and the like to generate MRI sequences. More specifically, gradient pulse amplifiers 20 apply current pulses to selected ones or pairs of gradient coil assemblies 22 to create magnetic field gradients along x, y, and z axes of the examination region 14. An RF transmitter 24 drives a whole-body RF coil 26 to transmit RF pulses or pulse packets into the examination region 14. A typical RF pulse is composed of a packet of immediately contiguous pulse segments of short duration, which taken together with each other and any applied gradients, achieve a selected magnetic resonance manipulation. For whole-body applications, the resonance signals or echoes are commonly picked up by the whole-body RF coil 26.

For generating images of local regions of the subject, specialized RF coils are placed contiguous to the selected region of interest. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals introduced by the whole-body RF coil 26. In any event, the resultant RF signals are picked up by the whole-body RF coil 26, the insertable RF coil, or another specialized RF coil and demodulated by a receiver 30. Preferably, a sequence control circuit 40 controls the gradient pulse amplifiers 20 and the transmitter 24 to produce a plurality of MRI pulse sequences that generate echoes received and sampled by the receiver 30.

Figure 2:
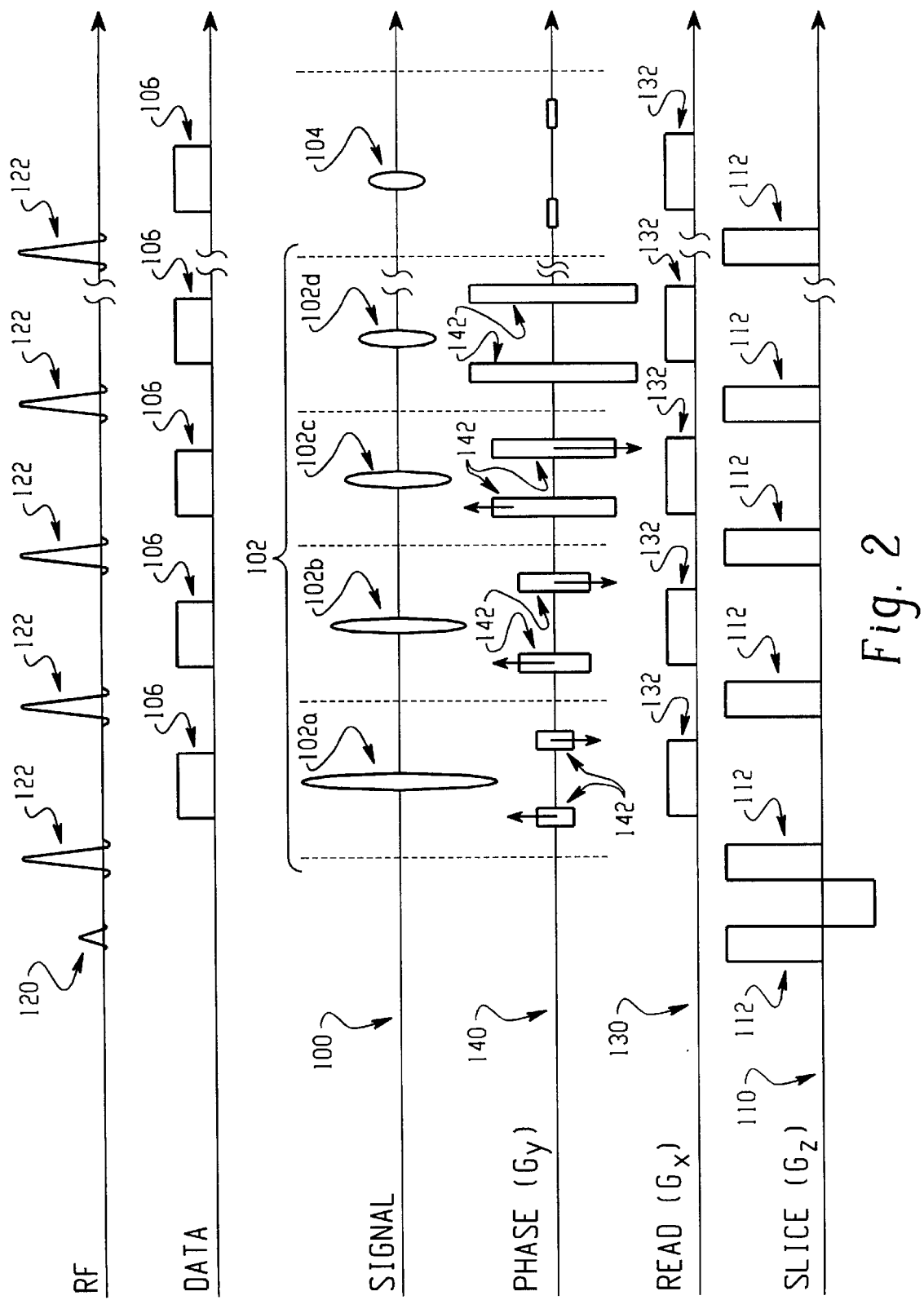
FIG. 2 is a diagrammatic illustration of one of a plurality of MRI pulse sequences produced in accordance with aspects of the present invention; and, FIG. 3 is a diagrammatic illustration of k-space in accordance with aspects of the present invention showing an exemplary order in which echoes fill in the same.

More specifically, a fast spin echo MRI sequence is described by way of the example sequence depicted in FIG. 2. Each MRI pulse sequence generates an MR signal 100 which emanates from the object being imaged. The MR signal 100 includes: (i) an echo-train 102 having a number of imaging echoes (preferably, between 16 and 64 imaging echoes) and (ii) a navigator echo 104. In one preferred embodiment of the present invention, the MRI pulse sequence is an FSE sequence generating a number of spin echoes 102*a–d* (in the interest of simplicity, only four of the preferred 16–64 echoes are illustrated) which correspond to the echo-train 102 of imaging echoes. After the final echo of the echo-train 102 is generated, an additional echo is generated corresponding to the navigator echo 104. While illustrated as a spin echo, optionally, a gradient or field echo is employed to reduce object heating as a result of the specific absorption rate (SAR). Additionally, as desired, the navigator echo 104 is alternately generated elsewhere in the MR signal 100 (e.g., prior to the echo-train 102 or at a point in between the imaging echoes). In any event, the echoes 102*a–d* and 104 are collected within a data acquisition window 106.

During a slice selection sequence 110 separate slice select gradient pulses 112 are applied to the gradient coil assembly 22 to select a cross-sectional slice of the object in which resonance is to be excited and from which the echoes 102*a–d* and 104 ultimately issue. Simultaneously with the slice select gradient pulses 112, a series of RF pulses are applied to the RF coil 26 via the RF transmitter 24. In the exemplary sequence, the RF pulses include an initial 90° flip angle resonance exciting RF pulse 120 followed by a series of 180° flip angle refocusing RF pulses 122. The application of each refocusing pulse 122 results in the generation of a spin echo thereafter.

A readout pulse sequence 130 applied to the gradient coil assembly 22 frequency encodes the received MR signal 100 along a first direction within the selected slice. The echoes are read out under readout gradient pulses 132. In addition to frequency encoding, the received MR signal 100 is also phase encoded via a phase encode pulse sequence 140 applied to the gradient coil assembly 22. The phase encode pulse sequence 140 includes a number of pairs of equal amplitude opposite polarity phase encode gradient pulses 142 which are applied before and after the echoes 102*a–d* to impart phase encoding before the echo and remove it after the echo. For signal to noise ratio (SNR) considerations, the phase encoding gradient is preferably zeroed or nulled for the navigator echo 104. Alternately, the phase encoding of the navigator echo 104 is a non-zero constant for each of the plurality of MRI pulse sequences. In any event, when enabled, the phase encoding is applied along a second direction within the selected slice which second direction is orthogonal to the first, frequency encoding or read direction. The individual echoes 102*a–d* are separately phase encoded by varying the amplitude and/or duration of the phase encoding gradient pulses 142.

With reference again to FIG. 1 and continuing reference to FIG. 2, the sequence control 40 initiates and directs the plurality of MRI pulse sequences that generate the MR signals 100 received by the receiver 30. For the selected sequence, the receiver 30 samples each echo a plurality of times resulting in data lines or arrays of sampled data points representing each echo. As each echo is collected and/or sampled by the receiver 30, a sorter 50 routes and/or loads the raw MR image data to data buffer memory 60 and routes the navigator echo data to a correction data memory 62. The storage devices are optionally random access memory (RAM), optical or electromagnetic disks, etc. While referred to as first and second memories, they are preferably separately addressable regions of a single data storage device.

With regard to the data memory 60, data lines from the imaging echoes are loaded into a matrix otherwise known as k-space. In a preferred embodiment, each of the imaging echoes is mapped into its own corresponding row or horizontal line of k-space such that each successively sampled data point value occupies successive columns. The row each echo is assigned to is based on the particular phase encoding imparted thereto via the phase encoding gradient pulses 142. In a preferred embodiment, for each echo-train 102, a first collected echo 102*a* is mapped to a central line of k-space while successively collected echoes are mapped to further out lines of k-space in a progressive manner alternating between positive (i.e., above the central or zero phase encode line) and negative (i.e., below the central line) k-space. Hence, later collected echoes end up filling the outermost portions of k-space. Preferably, the spacing in k-space between imaging echoes from the same echo-train 102 is such that, with each successive MRI pulse sequence, the collected imaging echoes fill k-space in an interleaved fashion, e.g., as shown in FIG. 3. For simplicity herein, FIG. 3 represents only four MRI pulse sequences generating four echo-trains 102 having four imaging echoes each. In practice, there are preferably 4 to 16 MRI pulse sequences each generating echo-trains 102 having between 64 and 16 imaging echoes, respectively, for a total of 256, 512, 1024, etc., data lines or rows of k-space. Alternately, other techniques, as are known in the art, are used to control the manner in which k-space is filled including, e.g., filling k-space using non-Cartesian trajectories.

Regarding the second or correction data memory 62, it receives the navigator echo data 104 generated by each MRI pulse sequence. Ultimately, information gleaned from the navigator echoes 104 is used to correct or adjust the sampled data points in k-space to account for data inconsistencies resulting from non-ideal system performance and other error causing factors including time-variant or dynamic factors (e.g., object motion). Preferably, the information obtained relates to phase errors in the imaging echoes and amplitude deviations in the imaging echoes. In a preferred embodiment, a data processor 70 accesses both memories and corrects the k-space data in accordance with error factors calculate, generated, or otherwise determined from the navigator echoes. The error factors include measures of phase error and scaled values of the average amplitude of the navigator echoes 104.

With respect to the phase errors, each individual navigator echo 104 is used to correct phase errors in those imaging echoes 102a–d generated by the same MRI pulse sequence which generated that individual navigator echo 104. In the preferred embodiment, (i) the excitation of resonance and the 180° resonance reversal are designed to have zero phase offset, (ii) after each echo, the phase encoding is removed, and (iii) there is no phase encoding applied to the navigator echo. Accordingly, the navigator echo has the same phase as at the initial excitation. The phase at excitation varies from excitation to excitation. In this manner, there are phase offsets between the echo trains.

The phase angle of each navigator echo relative to a preselected arbitrary reference angle is determined. The phase angle offset of each navigator echo relative to the reference phase angle is used to correct all of the image data from the corresponding sequence. More specifically, a unit vector $c_i^*$ is determined for the $i^{th}$ navigator echo that will adjust its phase to the reference angle. Each data line of the $i^{th}$ sequence is multiplied by the unit vector $c_i^*$ to standardize the phase. In this manner, the reference phase of all the data lines in k-space are standardized.

With respect to the amplitude deviations, in a preferred embodiment, scaled values of the average amplitude of all the collected navigator echoes 104 are used to correct amplitude deviations therefrom in all the imaging echoes collected into k-space. The amplitude of all the navigator echoes is averaged. The amplitude of each individual echo is compared to the average. All echoes in a given sequence are scaled in accordance with the deviation between its navigator echo and the average. In the preferred embodiment, the ratio of the amplitude $A_i$ of the $i^{th}$ navigator echo to the average amplitude $A_{avg}$ is determined. Each line in k-space is then multiplied by $(A_{avg}/A_i)c_i^*$ to standardize its phase and amplitude.

Optionally, $A_{avg}$ can be determined by a moving average. That is, rather than waiting for all imaging sequences to be run before starting the correction process, $A_{avg}$ can be based on less than all image sequences.

Optionally, the scaling factor used is linear, exponential, or otherwise as desired. By adjusting the relevant k-space data, the imaging echoes (which otherwise have amplitudes that deviate from their corresponding average amplitude as determined from the scaled values of the average amplitude of the navigator echoes 104) are corrected such that those in like positions in the echo-trains 102 have uniform amplitudes across MR signals 100. Preferably, the uniform amplitude to which they are corrected is in fact the corresponding average amplitude determined in accordance with the scaled values of the average amplitude of all the collected navigator echoes 104.

Preferably after the k-space data has been adjusted or corrected, a multi-dimensional Fourier transform and/or other appropriate reconstruction algorithms are applied thereto by a reconstruction processor 80. That is to say, the reconstruction processor 80 accesses the image data memory 60 and performs on the adjusted or corrected k-space data therein a Fourier transformation and/or other appropriate algorithms, as are known in the art, to reconstruct an image representation of the object being imaged. The image may represent a planar slice through the patient, an array of parallel planar slices, a three-dimensional volume, or the like. The image is then stored in an image memory 82 where it is accessed by a display, such as a video monitor 84 or other human viewable display or output device that provides a rendering of the resultant image.

Optionally, a one dimensional inverse Fourier transform can be performed in the x direction in k-space prior to the phase and amplitude correction. After the phase and amplitude connection, the data from $(x,k_y)$ space can be Fourier transformed in the y direction. In three-dimensional imaging, data in the z direction can be Fourier transformed before or after the phase and amplitude connection.

While the invention herein has been described with reference to the MRI apparatus detailed above, it is appreciated that the invention is applicable to other MRI apparatus. For example, the invention is equally amenable to open geometry magnets wherein opposing pole pieces, optionally joined by a ferrous flux return path, define an open examination region therebetween. Moreover, while described above in terms of two-dimensional (2D) or cross-sectional slice imaging, the invention is equally applicable to 3D or volume imaging wherein a volume of the object is excited rather than a slice. Likewise, while described above in terms of an FSE pulse sequence, other MRI pulse sequences may be equally applicable.

Generally, the invention has been described with reference to the preferred embodiments. obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance imaging comprising:
   (a) subjecting an object being imaged to a plurality of magnetic resonance imaging sequences, each imaging sequence generating a multiple echo echo-train;
   (b) phase encoding each echo;
   (c) collecting each echo into k-space as a plurality of sampled data points;
   (d) generating a navigator echo in conjunction with each of the plurality of imaging sequences;
   (e) collecting each navigator echo;
   (f) determining an average amplitude of the collected navigator echoes generated in step (d); and,
   (g) using the average amplitude of the collected navigator echos to adjust the sampled data points.

2. The method according to claim 1, wherein each individual navigator echo is also used to correct phase errors in those echoes generated by the same imaging sequence which generated that individual navigator echo.

3. The method according to claim 1, wherein the navigator echoes are generated with no phase encoding.

4. The method according to claim 1, wherein the navigator echoes are generated before an end of the echo-trains.

5. The method according to claim 1, wherein the imaging sequences are fast spin echo sequences.

6. The method according to claim 1, wherein the navigator echoes are echoes selected from a group consisting of spin echoes and gradient echoes.

7. The method according to claim 1, said method further comprising:
   (h) applying a multi-dimensional Fourier transformation in k-space to reconstruct an image representation of the object.

8. A magnetic resonance imaging apparatus comprising:
   MRI pulse sequence producing means which produce a plurality of MRI pulse sequences, each of said MRI pulse sequences inducing an MRI signal from a subject being examined, said MRI signal including (i) an echo-train containing a plurality of magnetic resonance imaging echoes and (ii) a navigator echo which follows its corresponding echo-train;
   a reception system that receives the imaging echoes and the navigator echoes, said imaging echoes being loaded into an image data storage device as k-space image data and said navigator echoes being loaded into a navigator echo storage device;
   a data correction processor which accesses the navigator echo storage device to determine, from navigator echoes loaded therein, image data correction factors which are used to correct the k-space image data, said image correction factors being based at least partially upon an average amplitude of the navigator echoes; and,
   a reconstruction processor that accesses the image data storage device to reconstruct the image data into an image representation, the data correction processor being connected with one of the image data storage device and the reconstruction processor for correcting the image data with the image data correction factors.

9. The magnetic resonance imaging apparatus according to claim 8, wherein the correction factors generated from the navigator echoes include measures of amplitude variation among the navigator echoes.

10. The magnetic resonance imaging apparatus according to claim 8, wherein the image data correction factors generated from the navigator echoes include measures of phase variation among the navigator echoes.

11. The magnetic resonance imaging apparatus according to claim 10, wherein the data correction processor adjusts k-space data such that phase variations among imaging echoes are nulled using correction factors generated from corresponding navigator echoes included in the same MRI signal.

12. A method of magnetic resonance imaging comprising:
   (a) subjecting an object being imaged to a plurality of magnetic resonance imaging sequences, each imaging sequence generating more than one echo;
   (b) phase encoding each echo;
   (c) collecting each echo into k-space as sampled data;
   (d) generating a navigator echo in conjunction with each of the plurality of imaging sequences;
   (e) collecting each navigator echo;
   (f) determining a unit vector corresponding to each navigator echo, said unit vector having a vector angle corresponding to a phase angle of the navigator echo;
   (g) determining a deviation between an amplitude of each navigator echo and an average amplitude of the navigator echoes generated in step (d);
   (h) adjusting a magnitude of each unit vector in accordance with the deviation between its amplitude and the average amplitude; and,
   (i) multiplying the data from each imaging sequence by the magnitude adjusted vector corresponding to the navigator echo associated with the sequence.

13. A method of magnetic resonance imaging, said method comprising:
   (a) subjecting an imaged region of an object being imaged to a plurality of magnetic resonance imaging sequences, each imaging sequence generating a multi-echo echo-train;
   (b) phase encoding each echo of the echo-train;
   (c) collecting each echo into k-space as a plurality of sampled data;
   (d) generating an additional navigator echo in conjunction with each of the plurality of imaging sequences;
   (e) collecting each navigator echo; and,
   (f) for an $i^{th}$ one of the imaging sequences, adjusting the sampled data by:

$$(A_{avg}/A_i)c_i*$$

wherein, $A_{avg}$ is an average amplitude of a plurality of navigator echoes, $A_i$ is the amplitude of the $i^{th}$ navigator echo, and $c_i*$ is a unit vector with an angular orientation corresponding to a phase angle of the $i^{th}$ collected navigator echo.

14. A magnetic resonance imaging apparatus comprising:
   MRI pulse sequence producing means which produce a plurality of MRI pulse sequences, each of said MRI pulse sequences inducing an MRI signal from a subject being examined, said MRI signal including (i) an echo-train containing a plurality of magnetic resonance imaging echoes and (ii) a navigator echo;
   a reception system that receives the imaging echoes and the navigator echoes, said imaging echoes being loaded into an image data storage device as k-space image data and said navigator echoes being loaded into a navigator echo storage device; and,
   a data correction processor which accesses the navigator echo storage device to determine, from navigator echoes loaded therein, image data correction factors which are used to correct the k-space image data, wherein the correction processor:
   (a) determines a phase angle of each navigator echo;
   (b) an amplitude variance of each navigator echo relative to the amplitudes of the other navigator echoes; and,
   (c) corrects the image data in accordance with (i) the determined phase angle and (ii) the determined amplitude variance determined from the navigator echo corresponding to the same echo-train as the corrected image data.

* * * * *